US009351415B2

(12) United States Patent
Zaccaria

(10) Patent No.: US 9,351,415 B2
(45) Date of Patent: May 24, 2016

(54) EASY FOLD COMBINATION SUN SHADE AND CASE FOR HANDHELD ELECTRONIC DEVICES

(71) Applicant: Nathan J. Zaccaria, Long Branch, NJ (US)

(72) Inventor: Nathan J. Zaccaria, Long Branch, NJ (US)

( * ) Notice: Subject to any disclaimer, the term of this patent is extended or adjusted under 35 U.S.C. 154(b) by 0 days.

(21) Appl. No.: 14/750,367

(22) Filed: Jun. 25, 2015

(65) Prior Publication Data

US 2016/0088752 A1 Mar. 24, 2016

Related U.S. Application Data

(60) Provisional application No. 62/071,441, filed on Sep. 24, 2014, provisional application No. 62/123,897, filed on Dec. 1, 2014, provisional application No. 62/123,898, filed on Dec. 1, 2014.

(51) Int. Cl.
| | |
|---|---|
| *H05K 5/03* | (2006.01) |
| *G02B 27/00* | (2006.01) |
| *G02B 1/11* | (2015.01) |
| *H04N 5/225* | (2006.01) |

(52) U.S. Cl.
CPC .. *H05K 5/03* (2013.01); *G02B 1/11* (2013.01); *G02B 27/0006* (2013.01); *H04N 5/2251* (2013.01)

(58) Field of Classification Search
CPC .... A47B 23/043; A47B 23/044; A47B 97/08; A47F 5/11; B65D 5/029; B65D 5/2019; B65D 2585/363; G02B 1/11; G02B 27/0006; H04N 5/2251; H05K 5/03
USPC .................. 206/320, 449, 453; 150/154, 165; 248/152, 174, 459, 688; 229/107
See application file for complete search history.

(56) References Cited

U.S. PATENT DOCUMENTS

| | | | | |
|---|---|---|---|---|
| 2,654,173 | A | * 10/1953 | Christensen | ......... G02B 27/024 248/459 |
| 5,218,474 | A | 6/1993 | Kirschner | |
| 5,508,757 | A | 4/1996 | Chen | |
| 5,877,896 | A | 3/1999 | Gremban | |
| 6,144,419 | A | 11/2000 | Schmidt | |
| 6,302,546 | B1 | 10/2001 | Kordiak | |
| 6,536,655 | B1 | * 3/2003 | Humphrey | ............. B65D 5/029 206/320 |

(Continued)

OTHER PUBLICATIONS http://www.banggood.com/Sun-Hood-Sun-Shade-for-DJI-Phantom-2-Vision-Vision-FC40-p-939698.html; Jun. 19, 2015 printout.
http://www.amazon.com/iclipse-the-sunshade-for-iPad/dp/B0060YBE8C/ref=pd_sxp_redirect.

(Continued)

*Primary Examiner* — Bryon Gehman
(74) *Attorney, Agent, or Firm* — Walter J. Tencza, Jr.

(57) ABSTRACT

A combination sun shade and a protective cover apparatus is provided, which may include a first set of sections which is substantially in a semicircular shape, wherein the semicircular shape may be defined by a first substantially straight line and a first substantially semicircular curve; a first further section connected to the first set of sections along a first portion of the first substantially straight line; a second further section connected to the first set of sections along a second portion of the first substantially straight line; and a third further section connected to the first set of sections along a third portion of the first substantially straight line. The apparatus may be configured so that it can be folded and placed into a first state; wherein in the first state the first further section, the second further section, and the third further section are substantially aligned with each other.

20 Claims, 16 Drawing Sheets

(56) References Cited

U.S. PATENT DOCUMENTS

| | | | |
|---|---|---|---|
| 8,919,549 B1 | 12/2014 | Tashjian | |
| 9,022,341 B2 * | 5/2015 | Radmard | F16M 11/00 248/459 |
| 2004/0206645 A1 * | 10/2004 | Roubanis | A45C 11/24 206/320 |
| 2011/0203955 A1 | 8/2011 | Fasula | |

OTHER PUBLICATIONS http://www.amazon.com/LILLIPUT-Sunhood-Sunshade-Monitor-VIVITEQ/dp/B00HG1GHRG.

http://www.hoodivision.com/#!products/cuou.

http://www.amazon.com/Cellphone-Monitor-Sunshade-Transmitters-Suitable/dp/B00LXD33EI.

\* cited by examiner

EASY FOLD COMBINATION SUN SHADE AND CASE FOR HANDHELD ELECTRONIC DEVICES

CROSS REFERENCE TO RELATED APPLICATION(S)

The present application claims the priority of U.S. provisional patent application Ser. No. 62/071,441, filed Sep. 24, 2014, titled "E.Z. fold—combination SUNSHADE & case for smartphones & e Readers"; U.S. provisional patent application Ser. No. 62/123,897, filed Dec. 1, 2014, titled "E.Z. fold combination sunshade & case for smartphones"; and U.S. provisional patent application Ser. No. 62/123,898, filed Dec. 1, 2014, titled "E.Z. fold combination sunshade & case for tablet computers and e-readers."

FIELD OF THE INVENTION

This invention relates to improved methods and apparatus concerning hand held electronic devices.

BACKGROUND OF THE INVENTION

There are various devices known in the art for hand held electronic devices.

SUMMARY OF THE INVENTION

One or more embodiments of the present invention provide a combination sun shade and a protective cover.

In at least one embodiment, an apparatus is provided comprising a first set of sections which is substantially in a semicircular shape, wherein the semicircular shape is defined by a first substantially straight line and a first substantially semicircular curve; a first further section connected to the first set of sections along a first portion of the first substantially straight line; and a second further section connected to the first set of sections along a second portion of the first substantially straight line; a third further section connected to the first set of sections along a third portion of the first substantially straight line. In at least one embodiment, the first portion of the first substantially straight line is connected to the second portion of the first substantially straight line; the second portion of the first substantially straight line is connected to the third portion of the first substantially straight line; and the second portion of the first substantially straight line is in between the first portion of the first substantially straight line and the third portion of the first substantially straight line.

In at least one embodiment, other than the connection of the first further section to the first set of sections along the first portion of the first substantially straight line, the first further section is not connected to the second or third further sections in any other way. In at least one embodiment, other than the connection of the second further section to the first set of sections along the second portion of the first substantially straight line, the second further section is not connected to the first or third further sections in any other way; other than the connection of the third further section to the first set of sections along the third portion of the first substantially straight line, the third further section is not connected to the first or second further sections in any other way; and the apparatus is substantially flat.

The first further section may have an opening, the second further section may have an opening; and the third further section may have an opening. The apparatus may be configured so that it can be folded and placed into a state in which the opening of the first further section, the opening of the second further section, and the opening of the third further section are substantially aligned with each other. The apparatus may be configured so that it can be folded and placed into a state in which the first further section, the second further section, and the third further section are substantially aligned with each other.

The apparatus may be configured so that it can be folded and placed into a first state; wherein in the first state the first further section, the second further section, and the third further section are substantially aligned with each other; wherein in the first state the first set of sections include a first region which is substantially pie shaped, a second region which is substantially rectangular shaped, and a third region which is substantially pie shaped; wherein the first region is connected to the second region; wherein the second region is connected to the third region; and wherein in the first state, the first region and the third regions are substantially perpendicular to the second region, and the first region and the third regions are substantially parallel to each other.

In the first state the apparatus may be configured to be held in an average human's hand by gripping the third region with the average human's thumb and simultaneously gripping the first region with the average human's other four fingers, and simultaneously having the first, second, and third further sections on top of a palm of the average human's hand.

The first region, the second region, the third region, and the aligned first, second, and third further sections together in the first state may form a chamber, which is configured to receive a mobile electronic communications device. The mobile electronic communications device may be a smartphone. The apparatus may be configured so that it can be folded and placed into a second state; wherein in the second state the first region is folded into first and second sub regions, and the third region is folded into first and second sub regions; wherein in the second state the second region is aligned with the first, second, and third further sections in a manner so that a pocket is formed between the second region and the aligned first, second, and third further sections; and wherein the first and second sub regions of the first region and the first and second sub regions of the third region are aligned with the first, second, and third further sections.

The first sub region of the first region may have a notch located at an outer edge; the third sub region of the third region may have a notch located at an outer edge. The notch of the first sub region allows insertion of an average human's thumb; and the notch of the third sub region allows insertion of an average human's thumb.

The apparatus may be configured so that it can be folded and placed into a second state; wherein in the second state the first region is folded into first and second sub regions, and the third region is folded into first and second sub regions; wherein in the second state the second region is aligned with the first, second, and third further sections in a manner so that a pocket is formed between the second region and the aligned first, second, and third further sections; wherein the first and second sub regions of the first region and the first and second sub regions of the third region are aligned with the first, second, and third further sections; and wherein the apparatus is configured to be changed from the first state to the second state while a mobile electronic communications device remains in the same position and orientation with respect to the first, second, and third further sections.

The apparatus may be configured so that failure to apply pressure to the first and third regions allows the apparatus to be changed from the first state to the second state.

In at least one embodiment a method is provided comprising the steps of: folding an apparatus into a first state; and placing a mobile electronic communications device into a chamber of the apparatus, while the apparatus is in the first state. The apparatus may be as previously described.

The method may include folding the apparatus into a second state, wherein the second state may be as previously described. In accordance with a method of an embodiment of the present invention, the apparatus may be changed from the first state to the second state while the mobile electronic communications device remains in the same position and orientation with respect to the first, second, and third further sections. The apparatus is configured so that failure to apply pressure to the first and third regions allows the apparatus to be changed from the first state to the second state.

BRIEF DESCRIPTION OF THE DRAWINGS

FIG. 8 shows the apparatus of FIG. 1A, the handheld electronic device, and the hand at a different orientation in FIG. 8 from FIG. 7, and along with a depiction of a light source, such as the sun;

DETAILED DESCRIPTION OF THE DRAWINGS

Figure 1A:
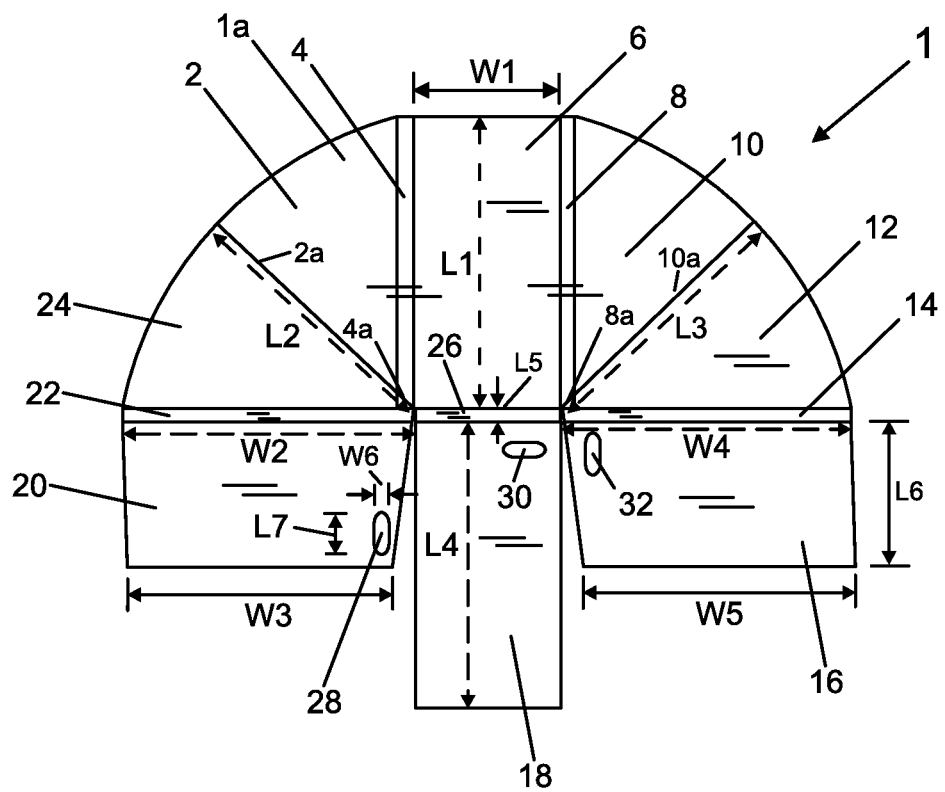
FIG. 1A shows a top view of an apparatus for use in accordance with one or more embodiments of the present invention, with the apparatus of FIG. 1A in a first state.
Figure 1B:
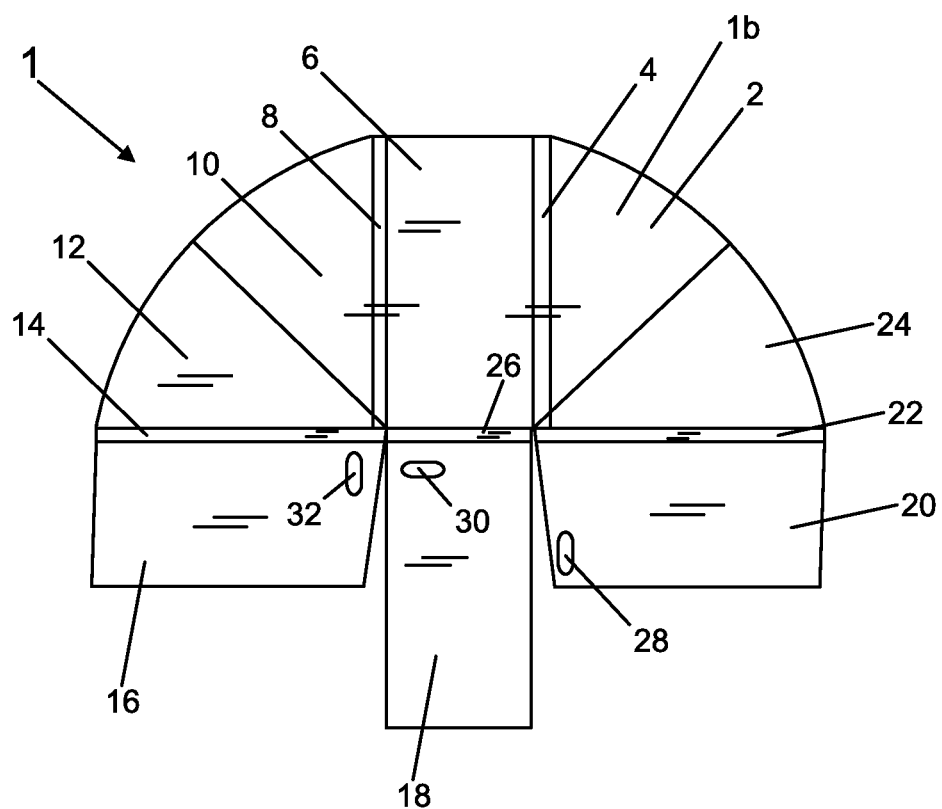
FIG. 1B shows a bottom view of the apparatus of FIG. 1A, with the apparatus of FIG. 1A in the first state.

FIG. 1A shows a top view of an apparatus 1 for use in accordance with one or more embodiments of the present invention, with the apparatus 1 shown in a first state in FIG. 1A. FIG. 1B shows a bottom view of the apparatus 1, with the apparatus 1 in the first state.

The apparatus 1 may be initially formed by laying a piece of material or sheet and cutting out a pattern in the shape of and in the dimensions of the apparatus 1. In at least one embodiment the substantially same basic pattern shown in FIGS. 1A and 1B may be used, however different sizes may be used depending on the smartphone, communications device or other electronics device which is used with the apparatus 1.

The apparatus 1 has a top side 1a shown in FIG. 1A and a bottom side 1b shown in FIG. 1B. Referring to FIGS. 1A-B, the apparatus 1 may be a flat sheet of material, such as paper, cardboard, and/or a flexible material such as but not limited to fabric.

The apparatus 1 may include sections 2, 4, 6, 8, 10, 12, 14, 16, 18, 20, 22, 24, and 26. Each of sections 2, 10, 12, and 24 may be shaped substantially like a slice of a pie. Section 2 may be bounded by an arc, a line segment 2a adjoining section 24, and a line segment adjoining section 4. Section 10 may be bounded by an arc, a line segment adjoining section 8, and a line segment 10a adjoining section 12. Section 12 may be bounded by an arc, the line segment 10a adjoining section 10, a line segment adjoining section 14, and a short line segment adjoining section 8. Section 24 may be bounded by an arc, the line segment 2a adjoining section 2, and a line segment adjoining section 22, and a short line segment adjoining section 4.

The line segment 2a and a much smaller line segment 4a together make up a straight fold line. The line segment 10a and a much smaller line segment 8a together make up a straight fold line. The straight fold line including segments 2a and 4a begins at the outer point on an outer arc where sections 2 and 24 meet and ends at the inner point where sections 20, 18, 4, and 6 meet. The straight fold line including segments 10a and 8a begins at the outer point on an outer arc where sections 10 and 12 meet and ends at the inner point where sections 16, 18, 8, and 6 meet.

Sections 2 and 10 may be shaped identically, but may be mirror images of one another. Sections 24 and 12 may be shaped identically, but be mirror images of one another. Section 2 is slightly different from section 24, because section 24 is not exactly pie shaped because of the small line segment boundary with section 4. Similarly, section 10 is slightly different from section 12, because section 12 is not exactly pie shaped because of the small line segment boundary with section 8.

The combination of fold line including line segment 2a and line segment 4a may be L2 inches in length, wherein L2 may be about six inches. The combination of the fold line including line segment 10a and line segment 8a may be L3 or inches in length, wherein L3 may be also be about six inches. Using dimensions of about six inches, in at least one embodiment, is particularly appropriate for an Iphone-6 (trademarked), and may also be appropriate for other smartphones. However, other dimensions are possible, depending on the size of smartphone or other electronics device.

Each arc of each of the slice of pie shaped sections 2, 10, 12, and 24 may have an arc length of about forty-five degrees.

Each of sections 4, 8, 14, 22, and 26 may be substantially rectangular shaped. Each of sections 4 and 8 may have a length L1 of about six inches and a width of about three eighths of an inch. Each of sections 14 and 22 may have a width W2 (or W4 which may be the same) of about six inches and a length of about three eighths of an inch. Section 26 may have a length L5 of about three eighths of an inch, and a width W1 of about three inches.

Each of sections 6 and 18 may be rectangular shaped and sections 6 and 18 may be substantially equal in size and shape. Each of sections 6 and 18 may have a width W1 of about three inches, and a length L1 (or L4 which may be the same) of about six inches. In some embodiments, section 6 may be slightly larger than section 18.

Each of sections 16 and 20 may be shaped in the form of a trapezoid, with the an outer side along the dimension of length L6, perpendicular or substantially perpendicular to the two sides along with width dimensions (W2 or W4), and with an inner side near the section 18, being slanted. The sides along the width W2 and W4 may have a width of about six inches. The outer sides of sections 16 and 20 may have a length L6 of three inches. Each of the sides along the widths W3 and W5 respectively, of the sections 20 and 16 may have widths W3 (or W5 which is the same) of about five and a half inches.

Sections 16, 18, and 20 have oval and/or circular openings 28, 30, and 32 respectively, which are equal to each other or substantially equal to each other. Each of openings 28, 30, and 32 may have a length of L7, which may be about three quarters of an inch.

Figure 6:
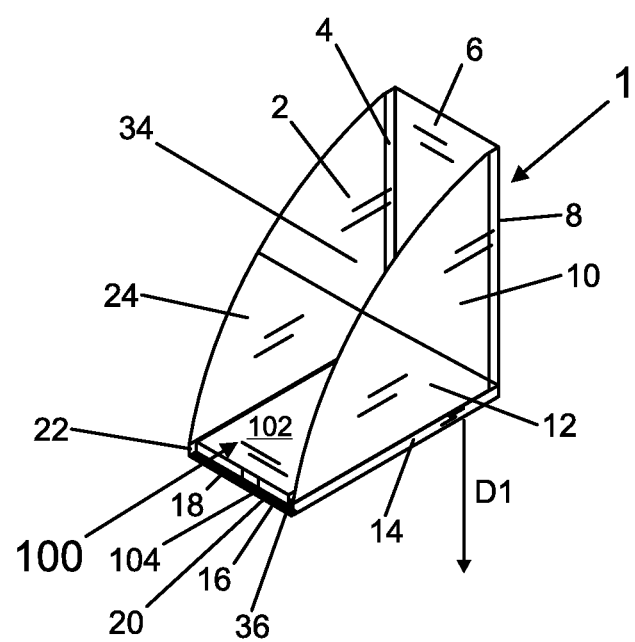
FIG. 6 shows the third perspective view of the apparatus of FIG. 1A with the apparatus of FIG. 1A in the fourth state, and along with a portion of the perspective view of the handheld electronic device, with the handheld electronic device shown placed inside a cavity or chamber of the apparatus of FIG. 1A.

Depending on the type of hand held electronic device 100 to be inserted into the apparatus 1, as in FIG. 6, in other embodiments of the present invention other sizes for the dimensions of the apparatus 1 are used.

Figure 2:
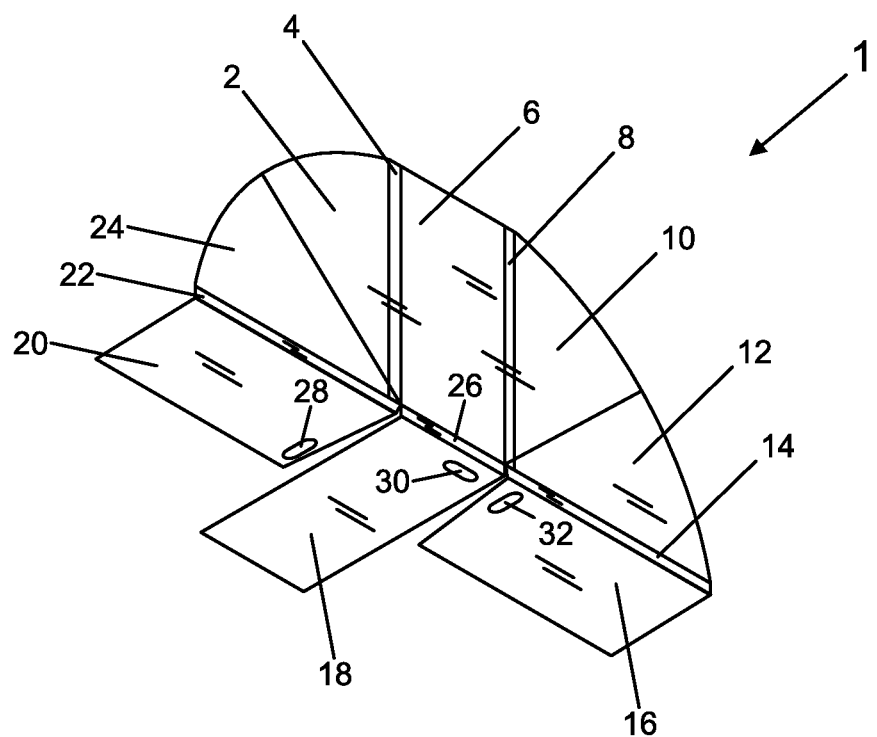
FIG. 2 shows a first perspective view of the apparatus of FIG. 1A, with the apparatus of FIG. 1A in a second state.

FIG. 2 shows a first perspective view of the apparatus 1, with the apparatus in a second state. To change the apparatus 1 from the first state shown in FIG. 1A to the second state shown in FIG. 2, the sections 16, 18, and 20 are folded along the line segments adjoining the sections 22, 26, and 14, respectively.

Figure 3:
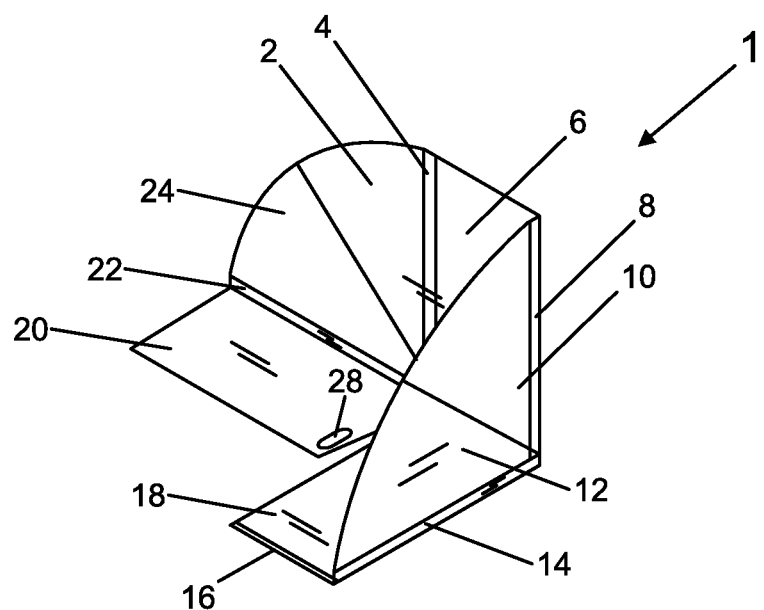
FIG. 3 shows a second perspective view of the apparatus of FIG. 1A with the apparatus of FIG. 1A in a third state.

FIG. 3 shows a second perspective view of the apparatus 1 with the apparatus 1 in a third state. To change the apparatus 1 from the second state shown in FIG. 2 to the third state shown in FIG. 3, the section 8 is folded inwards along the line segment adjoining the section 6. When this occurs, sections 10, 12, 14, and 16 are turned inwards, and section 16 is placed under section 18 in a manner such that opening 32 is aligned with opening 30. Section 16 is also placed under section 18 in a manner such that the free edge of section 18, which is perpendicular and/or substantially perpendicular to the edge which adjoins section 26, and which is closer to section 14 than to section 22, aligns with the line segment at which sections 14 and 16 meet.

For different smartphone or other electronic communication devices, which may be different sizes and/or different shapes, and/or have cameras or lenses, or openings in different locations, the openings 30, 32, and 28 may be in different locations, but typically openings 30, 32, and 28 would be configured to align with each other. The location of openings 28, 30, and 32 in FIGS. 1A-1B are shown to accommodate the camera lens for a typical Iphone-6 (trademarked).

Figure 4:
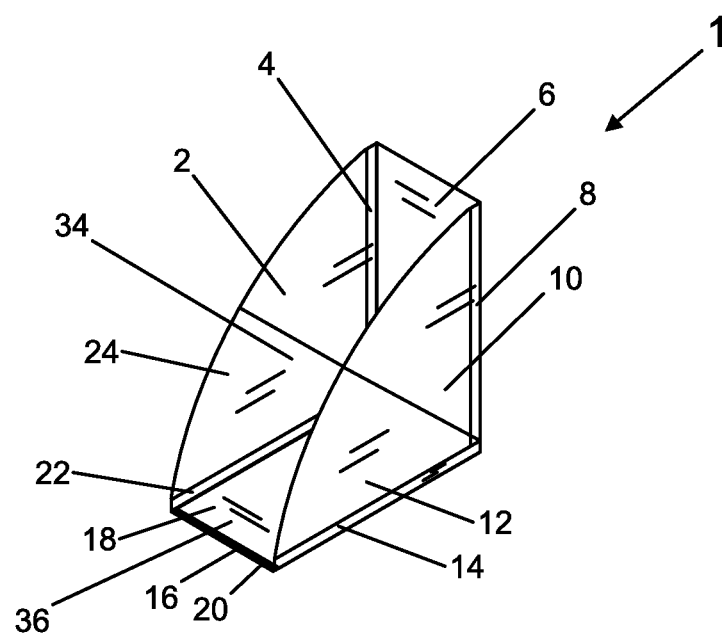
FIG. 4 shows a third perspective view of the apparatus of FIG. 1A with the apparatus of FIG. 1A in a fourth state.

FIG. 4 shows a third perspective view of the apparatus 1 with the apparatus 1 in a fourth state. To change the apparatus 1 from the third state shown in FIG. 3 to the fourth state shown in FIG. 4, the section 4 is folded inwards along the line segment adjoining the section 6. When this occurs, sections 2, 24, 22, and 20 are turned inwards, and section 20 is placed under sections 18 and 16, in a manner such that opening 28 is aligned with openings 30 and 32. Section 20 is also placed under sections 18 and 16 in a manner such that the free edge of section 18, which is perpendicular and/or substantially perpendicular to the edge which adjoins section 26, and which is closer to section 22 than to section 14, aligns with the line segment at which sections 22 and 20 meet.

In addition, in the fourth state, as shown in FIG. 4, the apparatus 1 has a chamber, cavity, or inner region 34 having a bottom inner region or pocket 36.

Figure 5:
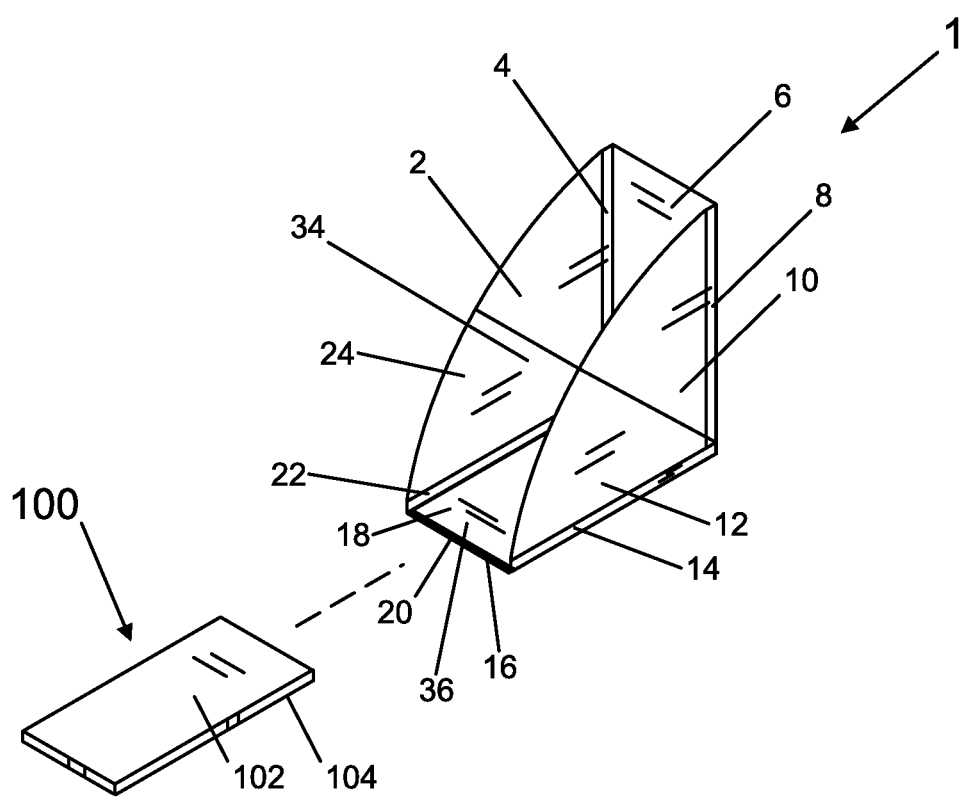
FIG. 5 shows the third perspective view of the apparatus of FIG. 1A with the apparatus of FIG. 1A in the fourth state, and along with a perspective view of a handheld electronic device, with the handheld electronic device shown separate from the apparatus of FIG. 1A.

FIG. 5 shows the third perspective view of the apparatus 1 with the apparatus 1 of FIG. 1A in the fourth state, and along with a perspective view of a handheld electronic device 100, with the handheld electronic device 100 shown separate from the apparatus 1. FIG. 6 shows the third perspective view of the apparatus 1 with the apparatus 1 in the fourth state, and along with a portion of the perspective view of the handheld electronic device 100, with the handheld electronic device 100 shown placed inside the pocket 36 within the cavity or the chamber 34 of the apparatus 1. The handheld electronic device 100 has a screen 102. The handheld electronic device 100 has a side 104 which is opposite the screen 102. The side 104 typically has a camera lens and/or camera lens aperture, not shown, which faces away from the side 104. In FIG. 6, the openings 28, 30, and 32 are aligned with each other and with the camera lens or camera lens aperture of side 104, not shown which faces away from the side 104. The side 104, in FIG. 6 lies on top of section 18, which lies on top of section 16, which lies on top of section 20. Thus a picture can be taken by the handheld electronic device 100 by use of the lens on side 104, which has a clear path through the opening 30 of section 18, through the opening 32 of section 16, and through the opening 28 of section 20.

Figure 7:
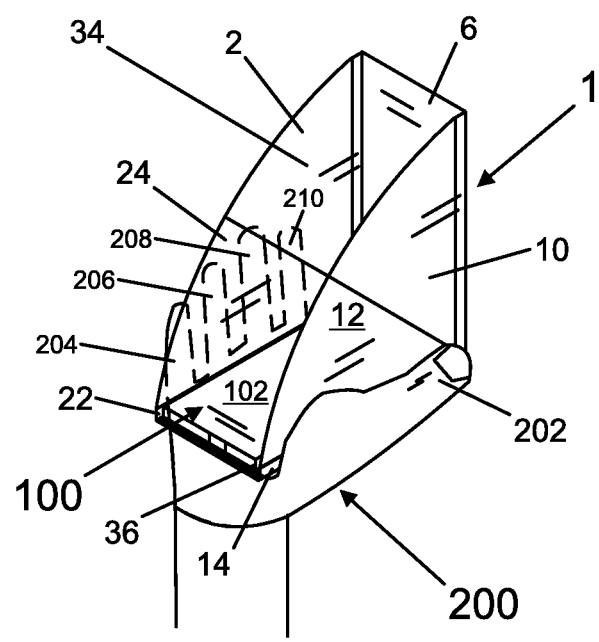
FIG. 7 shows the apparatus of FIG. 1A and the handheld electronic device as in FIG. 6, with the addition of a drawing of a hand holding the apparatus of FIG. 1A and the handheld electronic device.

FIG. 7 shows the apparatus 1 and the handheld electronic device 100 as in FIG. 6, with the addition of a drawing of a hand 200 holding the apparatus 1 and the handheld electronic device 100. The hand 200 includes thumb 202 and fingers 204, 206, 208, and 210. The thumb 202 presses against the section 14 which is supported structurally by the handheld electronic device 100, and against the section 12. The fingers 204, 206, 208, and 210 are typically for the most part, not visible in the view of FIG. 7, but are shown by dashed lines. The fingers 204, 206, 208, and 210 press against the section 22 which is supported structurally by the handheld electronic device 100, and against the section 24. The apparatus 1 and the handheld device 100 are thus held between the thumb 202 and the opposing fingers 204, 206, 208, and 210 in FIG. 7. With finger dexterity, the thumb 202, and the fingers 204, 206, 208, and 210 can grip and open and close the chamber 34, which therefore controls the widening and narrowing of the chamber 34 to a user's preference. The chamber 34 is identified in FIGS. 4, 5, 6, 7, and 9.

Figure 8:
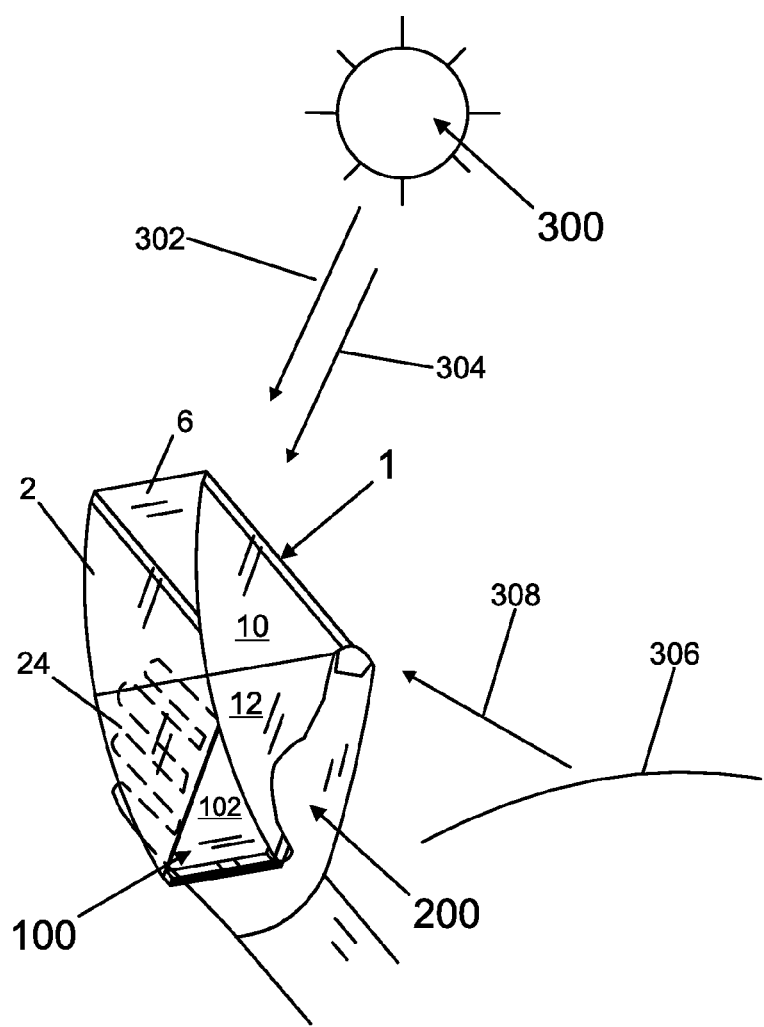
FIG. 8 shows the apparatus of FIG. 1A, the handheld electronic device, and the hand as in FIG. 7, except

FIG. 8 shows the apparatus 1, the handheld electronic device 100, and the hand 200 as in FIG. 7, except FIG. 8 shows the apparatus 1, the handheld electronic device 100, and the hand 200 at a different orientation in FIG. 8 from FIG. 7, and along with a depiction of a light source, such as the sun 300. In FIG. 8, the apparatus 1, including sections 2, 6, 10, 12, and 24, for example, shade the screen 102 of the handheld electronic device 100 from the rays 302 and 304 of the sun or light source 300, as well as from other source of light or reflected light, such as light ray 308 reflected off of ground source 306.

Figure 9:
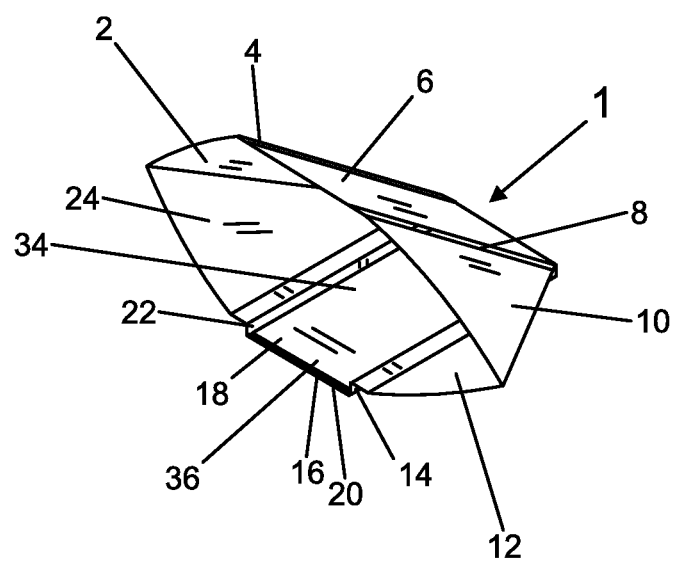
FIG. 9 shows a fourth perspective view of the apparatus of FIG. 1A in a fifth state.

FIG. 9 shows a fourth perspective view of the apparatus 1 in a fifth state. In the fifth state shown in FIG. 9, the sections 2 and 24 have been folded inwards along the line segment adjoining them; the sections 10 and 12 have been folded inwards along the line segment adjoining them; and the section 6 has been folded towards the section 18 along the line segment adjoining the section 26. The pocket region 36 is shown bounded by sections 22, 14, and 26 (not shown in FIG. 9, but shown in FIG. 2). Each of sections 22, 14, and 26 are upright and perpendicular to the section 18 forming an open box structure having a pocket region 36, in FIG. 9 with the exception of one open side. The device 100 can be placed in the pocket region 36 bounded by sections 22, 14, and 26, similar to as in FIG. 7, except apparatus 1 has been otherwise compressed as in FIG. 9. I.e. the pocket region 36 remains the same, with sections 22, 14, and 26 upright in both FIG. 7 and FIG. 9.

Figure 10:
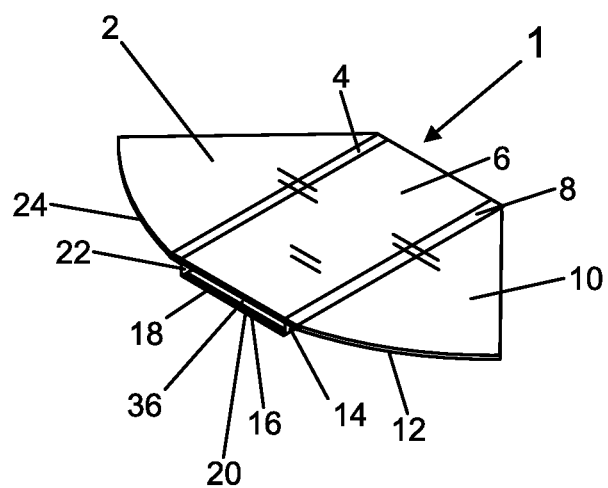
FIG. 10 shows a fifth perspective view of the apparatus of FIG. 1A in a sixth state.

FIG. 10 shows a fifth perspective view of the apparatus 1 in a sixth state. To change from the fifth state of FIG. 9 to the sixth state of FIG. 10, the section 2 is flattened on top of the section 24; the section 10 is flattened on top of the section 12, and the section 6 is folded until it is parallel to the section 18. However, the pocket region 36 remains the same as in FIG. 7 and FIG. 9, i.e. the sections 22, 14, and 26 remain upright and perpendicular with respect to the section 18, so that the device 100 can be inserted and/or remain inside the pocket region 36.

Figure 11:
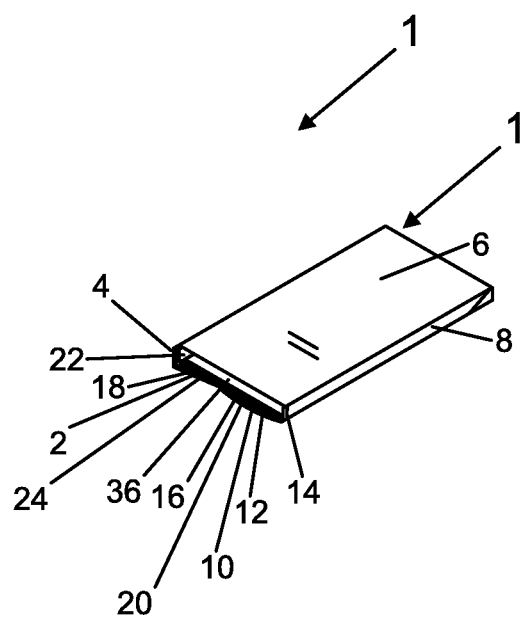
FIG. 11 shows the sixth perspective view of the apparatus of FIG. 1A in a seventh state.

FIG. 11 shows a sixth perspective view of the apparatus 1 in a seventh state. To change from the sixth state of FIG. 10 to the seventh state of FIG. 11 the sections 2 and 24 are folded under the sections 16, 18, and 20 so that the section 4 becomes parallel to the section 22; and the sections 10 and 12 are folded under the sections 16, 18, and 20 and the sections 2 and 24, so that the section 8 becomes parallel to the section 14. In FIG. 11, as in FIG. 10, the pocket region 36 remains the same as in FIG. 7 and FIG. 9, i.e. the sections 22, 14, and 26 remain upright and perpendicular with respect to the section 18, so that the device 100 can be inserted and/or remain inside the pocket region 36. The state of FIG. 11 provides a compact carrying case.

One or more of the folding procedures for transforming the apparatus from the first state shown in FIGS. 1A-B into the states and/or structures of FIGS. 2-11 may be similar to Kirigami, wherein a flat parcel of material is transformed into a three dimensional functioning creation.

FIGS. 1-11 have been used for convenience of description. However, other ways of folding or forming the apparatus 1 may be done. For example the following is a procedure of forming apparatus 1 into, for example, the state shown in FIG. 4.

To begin with, the apparatus 1, may be cut from an overall sheet of material. The overall sheet of material may be laid out and then the apparatus 1 or pattern may be cutout from the overall material. In at least one embodiment, the wedge areas between sections 20 and 18 and between sections 16 and 18 may be cut out last when cutting out apparatus 1.

Next, various fold lines or creases may be established in accordance with one or more embodiments of the present invention. A straight edge, such as a ruler, may be aligned along the line where section 8 and section 6 meet. The combination of sections 8, 10, 12, 14, and 16 may then be folded inwards along the line where sections 6 and 8 meet, until the section 8 is over section 6, the section 10 is at least partly over section 6 and substantially parallel to section 6, the section 12 is at least partly over section 6 and substantially parallel to section 6, the section 14 is at least partly over section 26 and substantially parallel to section 26, and the section 16 is at least partly over section 18 and substantially parallel to section 18.

Next, the combination of sections 8, 10, 12, 14, and 16 may be folded back to the flat state of FIG. 1A, by folding back along the line where sections 6 and 8 meet. This establishes a fold or crease along the line where sections 6 and 8 meet.

A straight edge, such as a ruler, may be aligned along the line where section 8 and section 10 meet. The combination of sections 10, 12, 14, and 16 may then be folded inwards along the line where sections 8 and 10 meet, until the section 10 is at least partly over section 6 and substantially parallel to section 6, the section 12 is at least partly over section 6 and substantially parallel to section 6, the section 14 is at least partly over section 26 and substantially parallel to section 26, and the section 16 is at least partly over section 18 and substantially parallel to section 18.

Next, the combination of sections 10, 12, 14, and 16 may be folded back to the flat state of FIG. 1A, by folding back along the line where sections 8 and 10 meet. This establishes a fold or crease along the line where sections 8 and 10 meet.

A straight edge, such as a ruler, may be aligned along the line where section 4 and section 6 meet. The combination of sections 4, 2, 24, 22, and 20 may then be folded inwards along the line where sections 4 and 6 meet, until the section 4 is at least partly over section 6 and substantially parallel to section 6, the section 2 is at least partially over section 6 and substantially parallel to section 6, the section 24 is at least partly over section 6 and substantially parallel to section 6, the section 22 is at least partly over section 26 and substantially parallel to section 26, and the section 20 is at least partly over section 18 and substantially parallel to section 18.

Next, the combination of sections 4, 2, 24, 22, and 20 may be folded back to the flat state of FIG. 1A, by folding back along the line where sections 4 and 6 meet. This establishes a fold or crease along the line where sections 4 and 6 meet.

A straight edge, such as a ruler, may be aligned along the line where section 4 and section 2 meet. The combination of sections 2, 24, 22, and 20 may then be folded inwards along the line where sections 2 and 4 meet, until the section 2 is at least partially over section 6 and substantially parallel to section 6, the section 24 is at least partly over section 6 and substantially parallel to section 6, the section 22 is at least partly over section 26 and substantially parallel to section 26, and the section 20 is at least partly over section 18 and substantially parallel to section 18.

Next, the combination of sections 2, 24, 22, and 20 may be folded back to the flat state of FIG. 1A, by folding back along the line where sections 2 and 4 meet. This establishes a fold or crease along the line where sections 2 and 4 meet.

A straight edge, such as a ruler, may be aligned along the line where the combination of sections 24, 4, 6, 8, and 12 meet the combination of sections 22, 26, and 14. The combination of sections 24, 2, 4, 6, 10, 12, 14, and 26 may then be folded inwards along the line where the combination sections 24, 4, 6, 8, and 12 meet the combination of sections 22, 26, and 14, until the sections 2, 24, and 4 are at least partially over section 20 and substantially parallel to section 20, the section 6 is at least partly over section 18 and substantially parallel to section 18, and the sections 8, 10, and 12 are at least partly over section 16 and substantially parallel to section 16.

Next, the combination of sections 24, 2, 4, 6, 10, 12, 14, and 26 may be folded back to the flat state of FIG. 1A, by folding back along the line where the combination of sections 24, 4, 6, 8, and 12 meet the combination of sections 22, 26, and 14; and this establishes a fold or crease along this line.

A straight edge, such as a ruler, may be aligned along the line where the combination of sections 22, 26, and 14 meet the combination of sections 20, 18, and 16. The combination of sections 22, 24, 2, 4, 6, 8, 10, 12, 14, and 26 may then be folded inwards along the line where the combination sections 22, 26, and 14 meet the combination of sections 20, 18, and 16, until the sections 22, 2, 24, and 4 are at least partially over section 20 and substantially parallel to section 20, the section 6 is at least partly over section 18 and substantially parallel to section 18, and the sections 14, 8, 10, and 12 are at least partly over section 16 and substantially parallel to section 16.

Next, the combination of sections 22, 24, 2, 4, 6, 10, 12, 14, and 26 may be folded back to the flat state of FIG. 1A, by folding back along the line where the combination of sections 22, 26, and 14 meet the combination of sections 20, 18, and 16; and this establishes a fold or crease along this line.

Next the section 2 can be folded onto the section 24 along the line adjoining sections 2 and 4 to form a fold or crease along this line. The section 2 and section 24 form a line which is at a forty-five degree angle to section 22 in at least one embodiment. The section 2 can be folded back to the state of FIG. 1A, after the line is formed with section 24.

Next the section 10 can be folded onto the section 12 along the line adjoining sections 10 and 12 to form a fold or crease along this line. The section 10 and section 12 form a line which is at a forty-five degree angle to section 14 in at least one embodiment. The section 10 can be folded back to the state of FIG. 1A after the line is formed with section 12.

Next with finger dexterity, and with section 20 held along the outer edge of section 20 farthest from section 18 with the thumb and forefinger of the left hand and with section 16 held along the outer edge of section 16, farthest from section 18 with the right hand thumb and forefinger, simultaneously inserting section 20 under section 18 and consecutively inserting section 16 under the now combined sections 20 and 18, the embodiment now transforms immediately into a three dimensional, functional, embodiment that can be made permanent by sewing, adhesion or lamination of sections or panels 20, 18, and 16 together, thus forming a three layered base on which the device for which this embodiment was designed that then can be placed and actively engaged and utilized as the sunshade device for which one or more embodiments are configured as shown in FIG. 4. Note that section 16 can be inserted under 18 first and then section 20 under section 16 or section 20 can be inserted under section 18 first and then section 16 under section 20 to form FIG. 4 state or its equivalent.

The apparatus can be transformed from a sunshade, such as in FIG. 4 to a protective case as follows.

While now in an upright position as in FIG. 4, with section 6 at right angles to section 18, begin folding section 6 down towards section 18 aligning the outer edge of section 18 with the outer edge of section 6, simultaneously folding sections 2 and 24 and sections 10 and 12 along the forty-five degree line at the respective junctures as shown in FIG. 9. For more definitive structural lines this procedure may be performed with a block the dimensions of the device for which this unit was calibrated firmly held in position on section 18.

The apparatus 1 is folded until it is in the state of FIG. 10.

Next, the combination of sections 2 and 24 shown in FIG. 10 can be folded down and around the base section 18 creasing firmly along the upper edge of the inserted shaping block (not shown), if any, and then creasing around the lower edge of the shaping block, if any, (not shown) bringing sections 2 and 24 behind the rear side of the base comprised of sections 18, 16, and 20, thus forming a five layer base.

Next, the combination of sections 10 and 12 shown in FIG. 10 can be folded down and around the base section 18 creasing firmly along the upper edge of the inserted shaping block (not shown) and then creasing firmly around the lower edge of the shaping block bringing sections 10 and 12 behind the rear side of the base comprised of sections 18, 16, 20, 2 and 24, thus forming a seven layer base. In at least one embodiment, any excess in sections 2, 12, 10, and/or 24 that extends beyond the outer edge of section 18 in FIG. 11 state (edge of section 18 parallel to edge of section 18 which adjoins section 26) can be cut or trimmed.

In the state of FIG. 11, the protective case is now formed for the apparatus 1. The shaping block (not shown) can be removed from the region or pocket 36 and the electronic device 100 for which it was configured can now be placed within pocket region 36, to be afforded all the protection for which it was configured.

For further utility a Velcro (trademarked) or any other type of adhesive can be added where the sections 2, 24, 10, and 12 conjoin at the rear of the case enclosure or apparatus 1 in the state of FIG. 11 to more securely hold this embodiment to comfortably fit into the pocket of a garment worn by an individual person.

The handheld electronic device 100 may be a smartphone such as an Iphone (trademarked) such as an Iphone 6 (trademarked) or any other model of an Iphone (trademarked). The device 100 may be any other type of smartphone. The dimensions of the apparatus 1 may be different depending on the size of the handheld electronic device 100, however, typically the overall shape and/or pattern of the apparatus 1, shown in FIGS. 1A-1B would be the same or substantially the same, in at least one or more embodiments.

A shown by FIG. 8, the apparatus 1 is particularly useful in shading the device 100 from the sun 300 or from some other light source or source of glare. The apparatus 1 may also be used as a privacy screen to prevent others from viewing or easily viewing content of messages on the screen 102.

The apparatus 1, shown in FIGS. 1A-1B may be made of multiple layers. For example, in at least one embodiment, the apparatus 1 may be made of one cloth on top of another (a double cloth), wherein the two cloths are amalgamated to each other. The inner cloth layer may be colored black to further reduce, prevent, or inhibit glare.

In at least one embodiment, the apparatus 1 may include two layers which are laminated together and may include an inside layer (layer facing inside the chamber 34 in FIG. 4) which may be colored black to diminish reflections and an outer layer (layer facing outside the chamber 34 in FIG. 4), which may have a color other than black and/or may have an aesthetically pleasing pattern or design. The one or more layers of the apparatus 1, can be thicker if desired to increase the overall firmness of the apparatus 1 in the state shown in FIG. 4. Alternatively, the apparatus 1 may only have one layer, which is colored black on the inside and some other color and/or design on the outside.

The apparatus 1 may be made of paper or a paperlike material, however, generally it is preferred that if paper is used the paper be of sufficient stock and/or stiffness to be structurally sound.

The sections 18, 16, and 20 form a three layer base for the handheld electronic device 100 to sit on. Sections 18, 16, and 20 may be glued and/or otherwise adhered together in the state of FIG. 4. The sections 18, 16, and 20 may also be connected together by sewing or lamination. The sections 18, 16, and 20 may also be joined together by Velcro (trademarked), magnetics, and/or in some other manner.

Figure 12A:
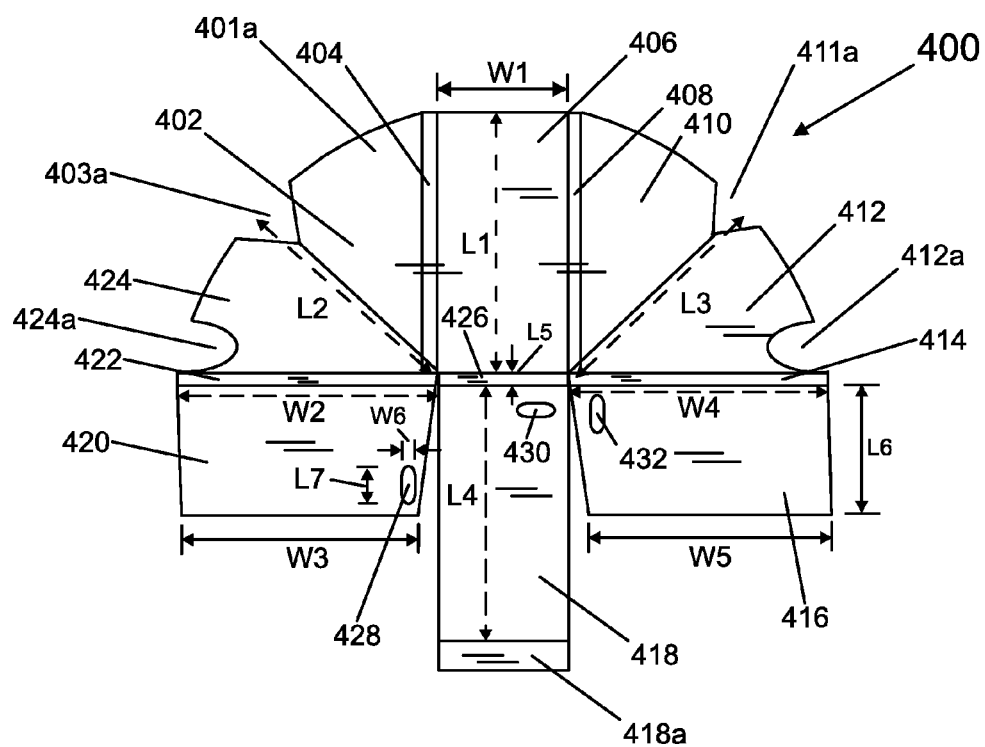
FIG. 12A shows a top view of another apparatus for use in accordance with one or more further embodiments of the present invention, with the apparatus of FIG. 12A in an eighth state.
Figure 12B:
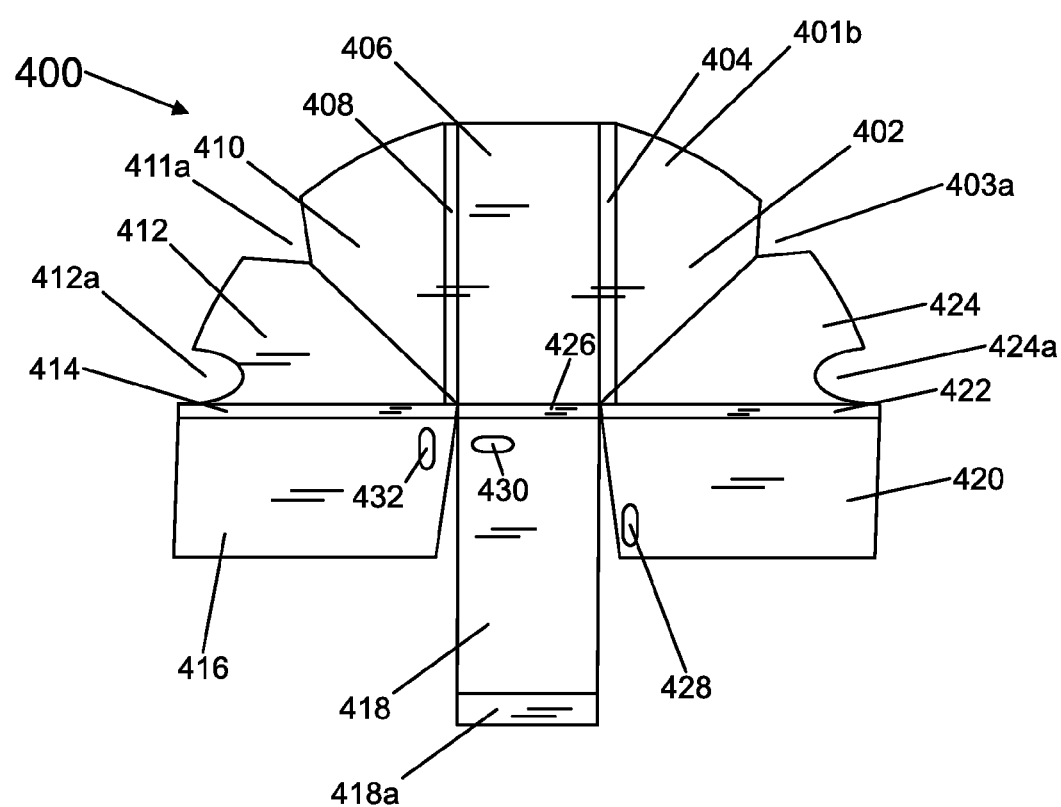
FIG. 12B shows a bottom view of the apparatus of FIG. 12A, with the apparatus of FIG. 12A in the eighth state.

FIG. 12A shows a top view of another apparatus 400 for use in accordance with one or more further embodiments of the present invention, with the apparatus 400 of FIG. 12A in an eighth state. FIG. 12B shows a bottom view of the apparatus 400 of FIG. 12A, with the apparatus 400 of FIG. 12A in the eighth state. The apparatus 400 may be identical to the apparatus 1 of FIG. 1A with some exceptions as will be described. The apparatus 400 has triangular or pie shaped openings 411a and 403a and about half oval openings 412a and 424*a*. The apparatus 1 does not have openings analogous to openings 410*a*, 402*a* 412*a*, and 424*a*. The apparatus 400 also has a section 418*a* attached to section 418. The apparatus 1 does not have a section analogous to section 418*a*.

The section 418*a* can also be called the retainer or section 418*a*. In at least one embodiment, when section 416 and 420 are folded under 418 they are flush with each other, both the retainer or section 418*a* can be rolled or folded back to hold a stiff piece of material in place which would act as a retainer 418*a* to hold the mobile phone or hand held electronic device 100 from slipping out of pocket or chamber 36 or similar to or analogous to pocket or chamber 36 shown in FIG. 5, but for apparatus 400. In another embodiment, the top surface shown in FIG. 12A of section 418 may have an adhesive and/or non slip surface to hold the device 100 in place on section 418 and thus in the chamber analogous to chamber 36. In another embodiment, the top surface shown in FIG. 12A of section 418 may have a stiff or hard platform insert made out of a material similar to plastic or composite to provide added support to the device 100 while in place on section 418 and thus in the chamber analogous to chamber 36.

Otherwise the apparatus 400 is identical or substantially identical to the apparatus 1. The apparatus 400 includes sections 402, 404, 406, 408, 410, 412, 414, 416, 418, 420, 422, 424, and 426, analogous to sections 2, 4, 6, 8, 10, 12, 14, 16, 18, 20, 22, 24, and 26 of apparatus 1, with the exceptions as previously described. The dimensions shown in FIG. 12A may be the same as the dimensions previously referred to with respect to FIG. 1A.

Depending on the type of hand held electronic device 100 to be inserted into the apparatus 400, in other embodiments of the present invention other sizes for the dimensions of the apparatus 400 are used.

Figure 13:
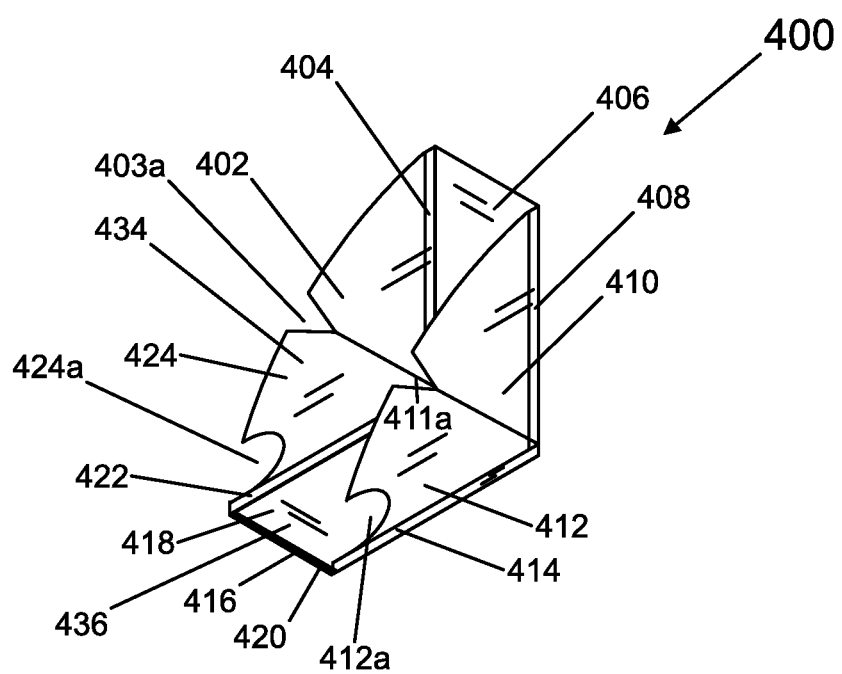
FIG. 13 shows a first perspective view of the apparatus of FIG. 12A with the apparatus of FIG. 12A in a ninth state.

FIG. 13 shows a first perspective view of the apparatus 400 of FIG. 12A with the apparatus of FIG. 12A in a ninth state. The apparatus 400 in the ninth state of FIG. 13 may be identical and by be formed in an identical manner to the apparatus 1 in the state of FIG. 4, with the exceptions of the openings 402*a*, 410*a*, 424*a*, and 412*a*.

In operation, a device 100 can be placed in a region 434 of apparatus 400, in the same manner that a device 100 is placed in the region 34 of apparatus 1. However, an individual may more easily touch the screen 102 by inserting a left thumb or other left finger through opening 424*a* and a right thumb or other right finger through opening 412*a*, when using apparatus 400. In this manner a person can touch the screen 102 to send a text or otherwise swipe, or select items, or icons, on the screen 102 of the device 100. The openings 424*a* and 412*a* may have a radius or radius of curvature of about three quarters of an inch to allow an average person's thumb to be inserted into either of openings 424*a* and 412*a*.

The openings 403*a* and 411*a* are cutouts that allow someone not to have to trim any excess from sections 402, 424, 410 and 412 when these are folded under 420, 418 and 416, similar to the apparatus 1 state of FIG. 11.

Figure 14:
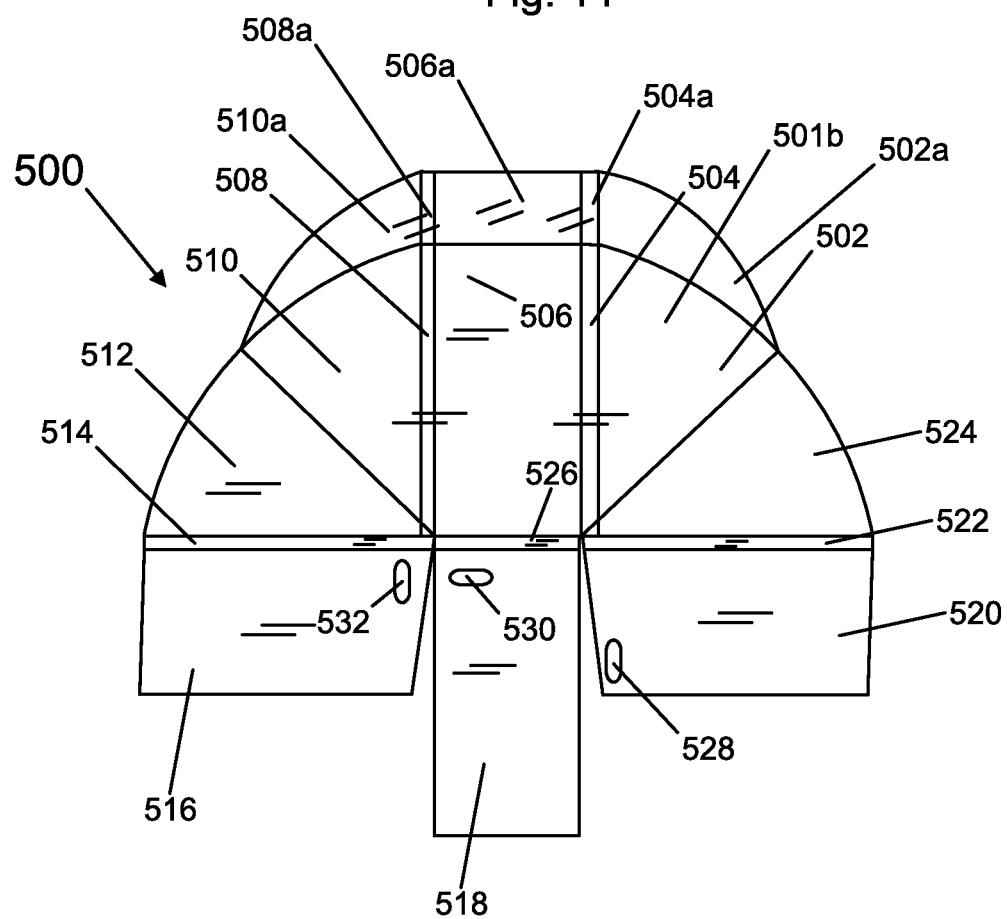
FIG. 14 shows a bottom view of another apparatus for use in accordance with one or more further embodiments of the present invention, with the apparatus of FIG. 14 in a tenth state.

FIG. 14 shows a bottom view of an apparatus 500 for use in accordance with one or more further embodiments of the present invention, with the apparatus 500 of FIG. 14 shown in a tenth state. The apparatus 500 may be the same as the apparatus 1 with exceptions as will be described. The apparatus 500 may include sections 502, 504, 506, 510, 512, 514, 516, 518, 520, 522, 524, 526, 528, 530, and 532 which may be similar or identical to sections 2, 4, 6, 10, 12, 14, 16, 18, 20, 22, 24, 26, 28, 30, and 32, respectively. The apparatus 500 may further include sections 502*a*, 504*a*, 506*a*, 508*a*, and 510*a* which may be extensions. The apparatus 500 may include side 501*b*.

The sections 502*a*, 506*a*, and 510*a* are extensions which make a larger shade chamber from the FIGS. 1A-B embodiment. In at least one embodiment, the sections 502*a*, 506*a*, and 510*a* may each be 1.3 inches in length, measured outwards from the sections 502, 506, and 510, respectively. In at least one embodiment, the entire width of the extensions 502*a*, 506*a*, and 510*a* follows the exact contour lines or approximate contour lines of the outermost edge of sections 502, 506, and 510.

If the apparatus 500 of FIG. 14 is placed in a state similar to FIG. 8 for apparatus 1, the extensions 502*a*, 506*a*, and 510*a* can be closed by folding and flattening it back onto the outer side of sections 502, 506, and 510. If the apparatus 500 of FIG. 14 is placed in states similar to FIGS. 9, 10, and 11 for apparatus 1, the apparatus 500 would be configured analogous to apparatus 1 except sections 502*a*, 510*a*, 508*a*, and 504*a* are added. In other words, even with the addition of the extensions 502*a*, 504*a*, 506*a*, 508*a*, and 510*a*, the apparatus 500 works the same as the apparatus 1 and can still function as both a sunshade and case while the electronic device 100 does not have to be removed just as it can without the extensions 502*a*, 504*a*, 506*a*, 508*a*, and 510*a*. Also without the extensions 502*a*, 504*a*, 506*a*, 508*a*, and 510*a*. the apparatus 1 has a three layer base when in states analogous to the states of FIG. 1 for FIGS. 4-10, and a seven layer base when in a state similar to FIG. 11, but with the extension it has a nine layer base. The extension when in a state similar to FIG. 11 for apparatus 1, adds an extra protective impact edge for the device and added layers of protection for the device for which it was intended.

Although the invention has been described by reference to particular illustrative embodiments thereof, many changes and modifications of the invention may become apparent to those skilled in the art without departing from the spirit and scope of the invention. It is therefore intended to include within this patent all such changes and modifications as may reasonably and properly be included within the scope of the present invention's contribution to the art.

I claim:

1. An apparatus comprising:
   a first set of sections which is substantially in a semicircular shape, wherein the semicircular shape is defined by a first substantially straight line and a first substantially semicircular curve;
   a first further section connected to the first set of sections along a first portion of the first substantially straight line;
   a second further section connected to the first set of sections along a second portion of the first substantially straight line;
   a third further section connected to the first set of sections along a third portion of the first substantially straight line; and
   wherein the first portion of the first substantially straight line is connected to the second portion of the first substantially straight line;
   wherein the second portion of the first substantially straight line is connected to the third portion of the first substantially straight line;
   wherein the second portion of the first substantially straight line is in between the first portion of the first substantially straight line and the third portion of the first substantially straight line;
   wherein other than being connected to the first set of sections along the first portion of the first substantially straight line, the first further section is not connected to the second or third further sections in any other way;

wherein other than being connected to the first set of sections along the second portion of the first substantially straight line, the second further section is not connected to the first or third further sections in any other way;

wherein other than being connected to the first set of sections along the third portion of the first substantially straight line, the third further section is not connected to the first or second further sections in any other way; and wherein the apparatus is substantially flat.

2. The apparatus of claim 1 wherein the first further section has an opening;

the second further section has an opening; and the third further section has an opening; and wherein the apparatus is configured so that it can be folded and placed into a state in which the opening of the first further section, the opening of the second further section, and the opening of the third further section are substantially aligned with each other.

3. The apparatus of claim 1 wherein the apparatus is configured so that it can be folded and placed into a state in which the first further section, the second further section, and the third further section are substantially aligned with each other.

4. The apparatus of claim 1 wherein the apparatus is configured so that it can be folded and placed into a first state;

wherein in the first state the first further section, the second further section, and the third further section are substantially aligned with each other;

wherein in the first state the first set of sections include a first region which is substantially pie wedge shaped, a second region which is substantially rectangular shaped, and a third region which is substantially pie wedge shaped;

wherein the first region is connected to the second region;

wherein the second region is connected to the third region; and wherein in the first state, the first region and the third region are substantially perpendicular to the second region, and the first region and the third region are substantially parallel to each other.

5. The apparatus of claim 4 wherein in the first state the apparatus is configured to be held in an average human's hand by gripping the third region with the average human's thumb and simultaneously gripping the first region with the average human's other four fingers, and simultaneously having the first, second, and third further sections on top of a palm of the average human's hand.

6. The apparatus of claim 4 wherein the first region, the second region, the third region, and the aligned first, second, and third further sections together in the first state form a chamber, which is configured to receive a mobile electronic communications device.

7. The apparatus of claim 6 wherein the mobile electronic communications device is a smartphone.

8. The apparatus of claim 4 wherein the apparatus is configured so that it can be folded and placed into a second state;

wherein in the second state the first region is folded into first and second sub regions, and the third region is folded into first and second sub regions;

wherein in the second state the second region is aligned with the first, second, and third further sections in a manner so that a pocket is formed between the second region and the aligned first, second, and third further sections; and wherein the first and second sub regions of the first region and the first and second sub regions of the third region are aligned with the first, second, and third further sections.

9. The apparatus of claim 8 wherein the first sub region of the first region has a notch located at an outer edge;

wherein the first sub region of the third region has a notch located at an outer edge;

wherein the notch of the first sub region of the third region allows insertion of an average human's thumb; and wherein the notch of the first sub region of the first region allows insertion of an average human's thumb.

10. The apparatus of claim 8 wherein the apparatus is configured so that failure to apply pressure to the first and third regions allows the apparatus to be changed from the first state to the second state.

11. The apparatus of claim 6 wherein the apparatus is configured so that it can be folded and placed into a second state;

wherein in the second state the first region is folded into first and second sub regions, and the third region is folded into first and second sub regions;

wherein in the second state the second region is aligned with the first, second, and third further sections in a manner so that a pocket is formed between the second region and the aligned first, second, and third further sections;

wherein the first and second sub regions of the first region and the first and second sub regions of the third region are aligned with the first, second, and third further sections; and wherein the apparatus is configured to be changed from the first state to the second state while a mobile electronic communications device remains in the same position and orientation with respect to the first, second, and third further sections.

12. A method comprising the steps of:

folding an apparatus into a first state; and placing a mobile electronic communications device into a chamber of the apparatus, while the apparatus is in the first state; and wherein the apparatus includes:

a first set of sections which is substantially in a semicircular shape, wherein the semicircular shape is defined by a first substantially straight line and a first substantially semicircular curve;

a first further section connected to the first set of sections along a first portion of the first substantially straight line;

a second further section connected to the first set of sections along a second portion of the first substantially straight line;

a third further section connected to the first set of sections along a third portion of the first substantially straight line; and wherein the first portion of the first substantially straight line is connected to the second portion of the first substantially straight line;

wherein the second portion of the first substantially straight line is connected to the third portion of the first substantially straight line;

wherein the second portion of the first substantially straight line is in between the first portion of the first substantially straight line and the third portion of the first substantially straight line;

wherein other than being connected to the first set of sections along the first portion of the first substantially straight line, the first further section is not connected to the second or third further sections in any other way;

wherein other than being connected to the first set of sections along the second portion of the first substantially straight line, the second further section is not connected to the first or third further sections in any other way;

wherein other than being connected to the first set of sections along the third portion of the first substantially straight line, the third further section is not connected to the first or second further sections in any other way;

wherein the apparatus is substantially flat prior to being folded into the first state; and wherein the first set of sections, and the aligned first, second, and third further sections together in the first state form the chamber, which is configured to receive the mobile electronic communications device.

13. The method of claim 12 wherein
the first further section has an opening;
the second further section has an opening; and
the third further section has an opening; and
wherein the apparatus is configured so that in the first state with the mobile electronic communications device placed in the chamber of the apparatus, the opening of the first further section, the opening of the second further section, and the opening of the third further section are substantially aligned with each other, and substantially aligned with a camera lens of the mobile electronic communications device.

14. The method of claim 12 wherein
in the first state the first further section, the second further section, and the third further section are substantially aligned with each other;
wherein in the first state the first set of sections include a first region which is substantially pie wedge shaped, a second region which is substantially rectangular shaped, and a third region which is substantially pie wedge shaped;
wherein the first region is connected to the second region;
wherein the second region is connected to the third region; and
wherein in the first state, the first region and the third region are substantially perpendicular to the second region, and the first region and the third region are substantially parallel to each other.

15. The method of claim 14 further comprising
while the apparatus is in the first state, gripping the third region with the average human's thumb and simultaneously gripping the first region with the average human's other four fingers, and simultaneously having the first, second, and third further sections on top of a palm of the average human's hand.

16. The method of claim 14 wherein
folding the apparatus into a second state;
wherein in the second state the first region is folded into first and second sub regions, and the third region is folded into first and second sub regions;
wherein in the second state the second region is aligned with the first, second, and third further sections in a manner so that a pocket is formed between the second region and the aligned first, second, and third further sections; and
wherein the first and second sub regions of the first region and the first and second sub regions of the third region are aligned with the first, second, and third further sections.

17. The method of claim 16 wherein
the first sub region of the first region has a notch located at an outer edge;
wherein the first sub region of the third region has a notch located at an outer edge;
wherein the notch of the first sub region of the first region allows insertion of an average human's thumb; and
wherein the notch of the first sub region of the third region allows insertion of an average human's thumb.

18. The method of claim 16 wherein
the apparatus is changed from the first state to the second state while the mobile electronic communications device remains in the same position and orientation with respect to the first, second, and third further sections.

19. The method of claim 16 wherein
the apparatus is configured so that failure to apply pressure to the first and third regions allows the apparatus to be changed from the first state to the second state.

20. The method of claim 12 wherein
the mobile electronic communications device is a smartphone.

* * * * *